US006395591B1

(12) United States Patent
McCormack et al.

(10) Patent No.: US 6,395,591 B1
(45) Date of Patent: May 28, 2002

(54) SELECTIVE SUBSTRATE IMPLANT PROCESS FOR DECOUPLING ANALOG AND DIGITAL GROUNDS

(75) Inventors: Stephen McCormack, Cupertino; Martin Alter, Los Altos; Robert S. Wrathall, Scotts Valley; Carlos Alberto Laber, Los Altos, all of CA (US)

(73) Assignee: Micrel, Incorporated, San Jose, CA (US)

( * ) Notice: Subject to any disclaimer, the term of this patent is extended or adjusted under 35 U.S.C. 154(b) by 6 days.

(21) Appl. No.: 09/733,543

(22) Filed: Dec. 7, 2000

(51) Int. Cl.[7] .......................................... H01L 21/8238
(52) U.S. Cl. ....................... 438/199; 438/200; 438/222; 438/357; 438/526; 257/357; 257/372
(58) Field of Search .................................. 438/199, 200, 438/202–206, 222, 234–236, 357, 526; 257/357, 372

(56) References Cited

PUBLICATIONS

Parpia et al., "A CMOS–Compatible High–Voltage IC Process", IEEE Transaction on Electron Devices, vol. 35, No. 10, Oct. 1988.*

Frei, M. et al, "Integration of High–Q Inductors in a Latch–up Resistant CMOS Technology", EDM 99, 31.5.1, pp. 757–760, 1999 IEEE.

* cited by examiner

Primary Examiner—Wael Fahmy, Jr.
Assistant Examiner—Hsien-Ming Lee
(74) Attorney, Agent, or Firm—Skjerven Morrill LLP

(57) ABSTRACT

An integrated circuit fabrication process includes a selective substrate implant process to effectively decouple a first power supply connection from a second power supply connection while providing immunity against parasitic effects. In one embodiment, the selective substrate implant process forms heavily doped p-type regions only under P-wells in which noise producing circuitry are built. The noisy ground connection for these P-wells are decoupled from the quiet ground connection for others P-wells not connected to any heavily doped regions and in which noise sensitive circuitry are built. The selective substrate implant process of the present invention has particular applications in forming CMOS analog integrated circuits where it is important to decouple the analog ground for sensitive analog circuitry from the often noisy digital grounds of the digital and power switching circuitry.

17 Claims, 2 Drawing Sheets

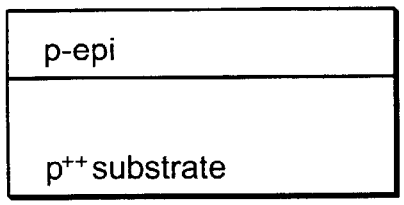
FIG._1A
(Prior Art)
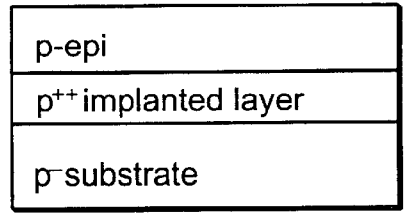
FIG._1B
(Prior Art)
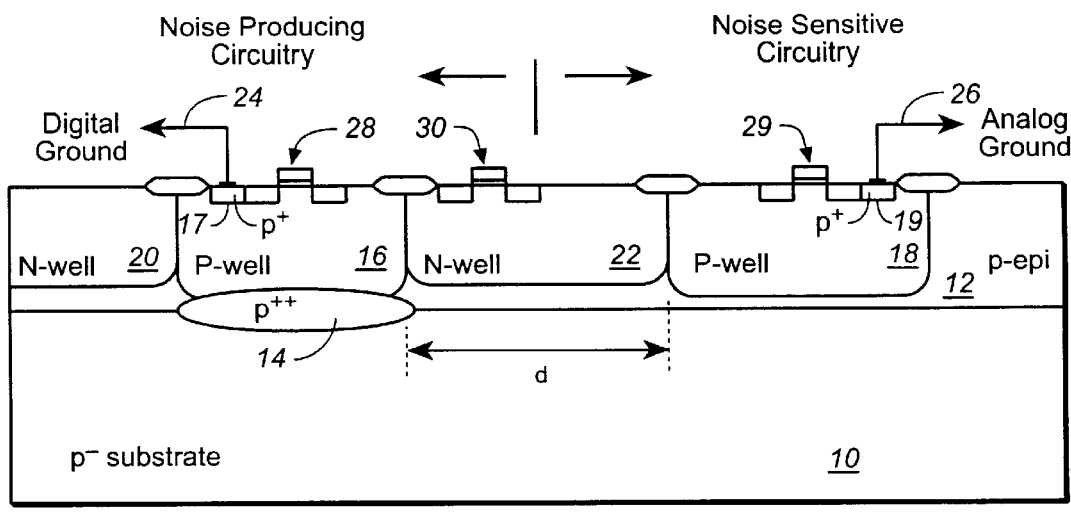
FIG._2
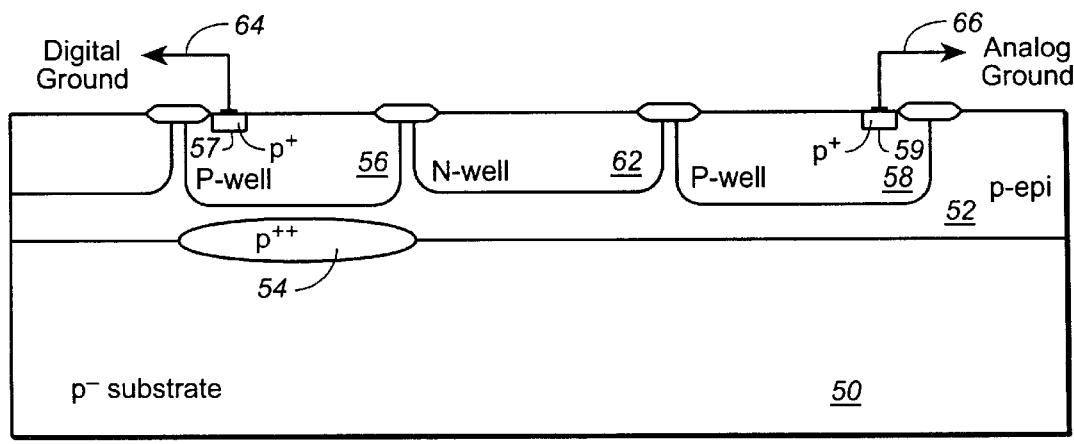
FIG._3

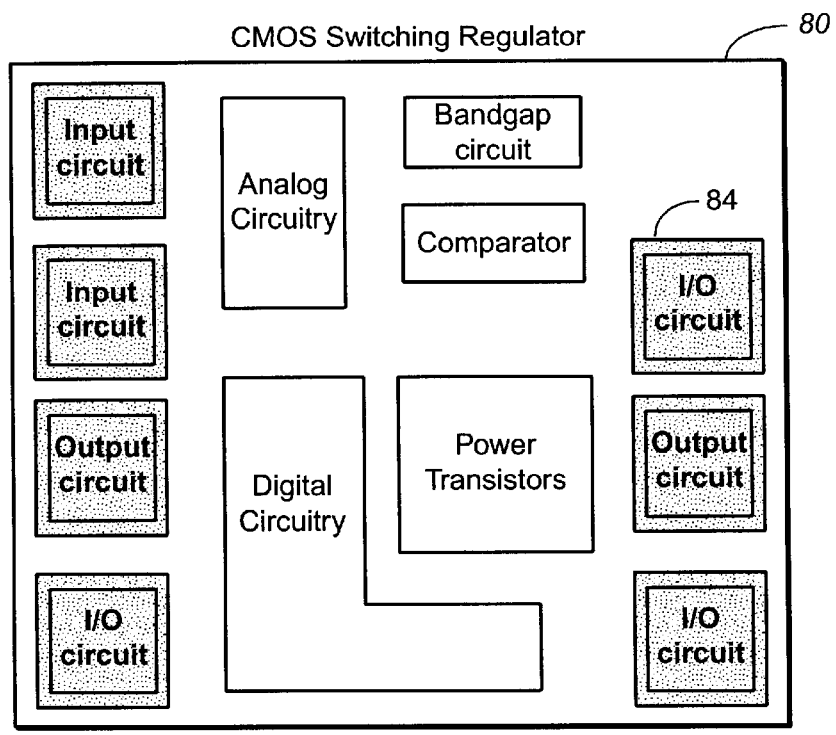
FIG._4
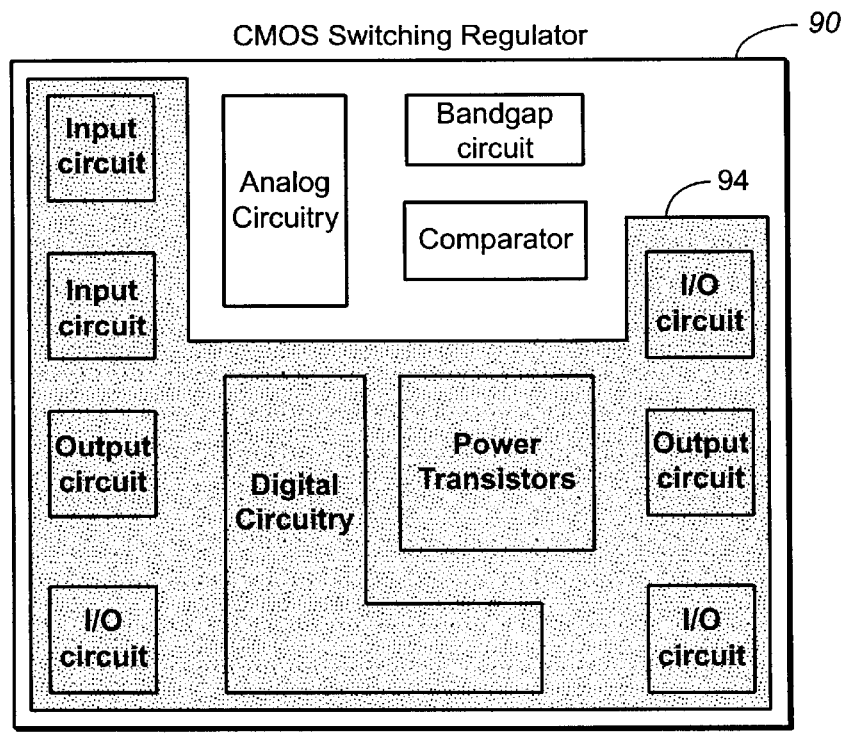
FIG._5

SELECTIVE SUBSTRATE IMPLANT PROCESS FOR DECOUPLING ANALOG AND DIGITAL GROUNDS

BACKGROUND OF THE INVENTION

1. Field of the Invention

The invention relates to a method in a semiconductor fabrication process, and more particularly to a method in a CMOS fabrication process for decoupling noisy and quiet electrical grounds.

2. Description of the Related Art

Semiconductor fabrication processes for manufacturing integrated circuits use a starting material of either a p-type substrate or an n-type substrate. The p-type substrate is more prevalent in CMOS devices today because, among other things, the body of the integrated circuit thus built can be connected to an electrical ground and is thus compatible with most types of integrated circuit packages. While a lightly doped p-type substrate having a resistivity of 5 or 20 ohm-cm has been used in early fabrication processes, this was found to be problematic for CMOS integrated circuits because the high substrate resistance renders the integrated circuit more susceptible to latchup.

One method to improve latchup immunity is to use a heavily doped substrate, i.e. a p++ substrate, with a lightly doped epitaxy layer grown on top. Such a substrate structure is illustrated in FIG. 1A. The p++ substrate can have a resistivity as low as 0.05 ohm-cm. While the use of a heavily doped p++ substrate can effectively reduce latchup susceptibility, the heavily doped substrate is typically more expensive and can introduce problems such as auto-doping in the manufacturing process. Furthermore, the heavily doped p++ substrate is not desirable for building integrated circuits including analog and digital components. This is because the low resistance of the p++ substrate has the effect of shorting the electrical ground of the digital and power switching circuitry which are typically noisy to the electrical ground of the analog circuitry which needs to be quiet or free from ground noise. A substrate structure including a blanket p++ buried layer in a lightly doped p-type substrate has been proposed and is illustrated in FIG. 1B. While the use of a p− substrate can avoid problems such as auto-doping, the substrate structure of FIG. 1B does not solve the ground noise coupling issue as the ground of the noisy circuitry is still coupled to the ground of the quiet circuitry through the p++ buried layer.

Therefore, it is desirable to provide a CMOS fabrication process which is capable of providing decoupling of the electrical ground for quiet and noisy circuitry while providing immunity against latchup and electrostatic discharge.

SUMMARY OF THE INVENTION

According to the present invention, an integrated circuit fabrication process uses a selective substrate implant process which is capable of providing effective decoupling of a first power supply connection from a second power supply connection while providing immunity against parasitic effects. The first power supply may be a noisy electrical ground connection and the second power supply may be a quiet electrical ground connection.

According to one embodiment of the present invention, a method for forming a CMOS structure includes providing a substrate of a first type, masking a surface of the substrate to selectively expose regions of the substrate, doping the substrate using dopants of the first type to form heavily doped regions, forming an epitaxy layer of the first type on the substrate where the epitaxy layer is more lightly doped than the heavily doped regions, masking a surface of the epitaxy layer to selectively expose a first group and a second group of well regions of the first type where the first group of the well regions are disposed over the heavily doped regions, and doping the epitaxy layer using dopants of the first type to form the well regions of the first type.

The selective substrate implant process of the present invention has particular applications in forming CMOS analog integrated circuits where it is important to decouple the analog ground for noise-sensitive analog circuitry from the often noisy digital ground of the digital and power switching circuitry. The present invention is better understood upon consideration of the detailed description below and the accompanying drawings.

BRIEF DESCRIPTION OF THE DRAWINGS

FIG. 1A is a cross-sectional view of a conventional substrate structure including a p++ substrate and a p-type epitaxy layer.

FIG. 1B is a cross-sectional view of a conventional substrate structure including a p− substrate, a blanket p++ implanted layer and a p-type epitaxy layer.

FIG. 2 is a cross-sectional view of a CMOS structure formed using a selective substrate implant process according to one embodiment of the present invention. FIG. 3 is a cross-sectional view of a CMOS structure formed using a selective substrate implant process according to another embodiment of the present invention.

FIG. 4 is an exemplary selective substrate implant mask for use in the manufacture of a CMOS switching regulator according to one embodiment of the present invention.

FIG. 5 is an exemplary selective substrate implant mask for use in the manufacture of a CMOS switching regulator according to another embodiment of the present invention.

In the present disclosure, like objects which appear in more than one figure are provided with like reference numerals.

DETAILED DESCRIPTION OF THE PREFERRED EMBODIMENTS

According to one embodiment of the present invention, an integrated circuit fabrication process uses a selective substrate implant process to provide a substrate structure which can provide decoupling of power supply noise, such as ground noise, between noisy and noise sensitive circuits and also immunity against latchup and electrostatic discharge. The selective substrate implant process has particular applications in CMOS analog integrated circuits where it is important to decouple the analog ground for sensitive analog circuitry from the often noisy digital grounds of the digital and power switching circuitry. When applied in the fabrication of CMOS analog integrated circuits, the selective substrate implant process of the present invention is capable of enhancing the circuit performance while offering protections against parasitic effects.

FIG. 2 is a cross-sectional view of a CMOS structure formed using a selective substrate implant process according to one embodiment of the present invention. In the present embodiment, the fabrication process uses a lightly doped p-type substrate 10 as the starting material. The selective substrate implant process is used to formed a heavily doped p++ region 14. Region 14 is generally referred to as a buried layer in semiconductor processing. Then, a p-type epitaxy layer (p-epi) 12 is grown on the substrate 10 and a subsequent conventional twin tub process is carried out to form N-wells (20 and 22) and P-wells (16 and 18) in the p-epi layer 12. Subsequently, conventional fabrication process steps are used to form p-channel transistors (e.g. transistor 30) in the N-wells and n-channel transistors (e.g. transistors 28 and 29) in the P-wells.

In FIG. 2, P-well 16 is formed on top of p++ region 14. Thus, p++ region 14 has the effect of lowering the well resistance of P-well 16. P-well 16 is electrically connected to a ground potential through a p+ diffusion region 17, and in FIG. 2, P-well 16 is coupled to a "digital ground" on terminal 24. Meanwhile, P-well 18 is formed in p-epi 12 in a region without any p++ heavily doped region. P-well 18 is electrically connected to a ground potential through a p+ diffusion region 19, and in FIG. 2, P-well 18 is coupled to an "analog ground" on terminal 26.

In accordance with the present invention, the heavily doped p++ region 14 are selectively placed in p-type substrate 10 to achieve either the purpose of enhancing latchup suppression or decoupling power supply noise or both. When latchup suppression is of concern, the p++ regions can be selectively placed in P-wells where circuits susceptible to latchup is built. Examples of latchup susceptible circuits are input circuit, output circuits, or bi-directional I/O circuits. When noise decoupling is of concern, the p++ regions can be selectively placed in P-wells where noise producing circuits are built so that the power supply noise generated by these noise producing circuits can be isolated from the power supply of noise sensitive circuits.

Thus, in one embodiment, the p++ heavily doped region 14 can be selectively placed to decouple the digital ground (terminal 24) from the analog ground (terminal 26) so that ground noise generated by certain noisy circuits would not impact the performance of other noise sensitive circuits built on substrate 10. In the present description, the term "digital ground" refers to the electrical ground for circuitry built in P-well 16 which are noise producing. Generally, the noise producing circuitry are digital circuits such as logic gates and flip flops. Noise producing circuitry may also include power switching devices which are not digital circuits but produces large amount of ground noise in operation. In the present description, the term "digital ground" is used generally to refer to the electrical ground potential of noise producing circuits, whether the circuits are digital or not. On the other hand, the term "analog ground" in the present description refers to the electrical ground for circuitry built in P-well 18 which are noise sensitive. The noise-sensitive circuitry typically includes analog circuits where precision in circuit voltage levels is critical for the operation of the circuits. In the following description, P-well 18 is also referred to as a "quiet P-well" to indicate that the P-well is electrically connected to a quiet ground potential and is used for building noise sensitive circuits. Also, the analog ground is sometimes referred to as the "quiet ground" and the digital ground is sometimes referred to as the "noisy ground."

In the present embodiment, n-channel transistors of the noise producing circuitry are built in P-well 16 which is coupled to p++ region 14 while n-channel transistors of the noise sensitive circuitry are built in P-well 18 which is not coupled to any heavily doped regions. By including p++ region 14 only under P-well 16 where noise producing circuits are built, the digital ground (terminal 24) including ground noise generated by the n-channel transistors of P-well 16 is decoupled from the analog ground of the n-channel transistors of P-well 18. Thus, the noise sensitive circuits built in P-well 18 are protected from the ground noises that may be detrimental to their operations.

Examples of noise producing circuitry in a CMOS analog integrated circuit are input/output (I/O) circuits, logic gates, digital switches, and power MOSFET switches. Generally, the substrate noise is generated through one or more of the following mechanisms: impact ionization, shoot-through current, ground bounces, and displacement currents. For instance, the I/O circuits generate substrate noise during switching of the output voltage. As mentioned above, I/O circuits are susceptible to latchup if not properly guarded. A conventional way to reduce latchup susceptibility is to lower the resistance of the P-wells. A low P-well resistance has the effect of decoupling the parasitic bipolar transistors formed by the source/drain regions and the n and p tubs in a CMOS process. In the present embodiment, a low resistance P-well is provided by selectively placing p++ heavily doped regions underneath P-wells where I/O circuits are to be built. Thus, the I/O circuits can be protected against latchup. Another common concern for I/O circuits is electrostatic discharge (ESD) events. While some ESD protection circuits require a p++ buried layer, other ESD protection circuits, such as those relying on the SCR action to dissipate the ESD energy, work better without a p++ buried layer. Therefore, the fabrication process of the present invention can be used to selectively place p++ heavily doped regions only where it is required so that the operation of the ESD protection circuits is optimized. Digital switches and power MOSFET generate substrate noise during switching operations. In particular, power MOSFETs, typically used to provide one to three amperes of output current, can generate a substantial amount of shoot-through current. By building the n-channel devices of the power switches in P-wells such as P-well 16, any ground noise generated by the power switches will not affect the analog ground connection for noise sensitive circuitry.

Examples of noise sensitive circuitry in a CMOS analog integrated circuit are op-amps, comparators, bandgap reference circuits, analog resistors, current mirrors, differential pairs, and LDO (low-dropout) voltage regulators. Basically, all precision components in a CMOS analog integrated circuit need to be protected from ground noise. For instance, a bandgap reference circuit is very sensitive to ground noise and can generate an inaccurate reference voltage value if the electrical ground for the reference circuit is noisy. Thus, it is important to place the npn transistors of a bandgap reference circuit in a P-well coupled to the quiet analog ground and decoupled from the noisy digital ground.

To effectuate decoupling of the digital ground from the analog ground, a minimum distance d between the edge of the p++ region 14 and quiet pwell 18 must be maintained. While a longer distance d means better decoupling, the distance d cannot be made so large as to increase the die size of the integrated circuit to an excessive amount. Typically, a distance d of 100 $\mu$m is sufficient to provide adequate decoupling without unduly increasing the die size of the integrated circuit, if at all. Of course, the value of minimum distance d may be varied based on the fabrication process and the tolerance of the integrated circuits to noise and latchup effects.

In the present embodiment, p++ region 14 is aligned with P-well 16. In another embodiment, p++ region 14 may extend beyond the boundary of P-well 16 into the area under N-well 22 for example. In certain applications, it may be advantageous to have a p++ region in the epi layer underneath N-well 22. For example, when a Schottky diode or a lateral PNP bipolar transistor is made in N-well 22, it may be advantageous to extend the p++ region 14 into the area under N-well 22 to reduce the N-well capacitance and to improve the performance of these devices.

In FIG. 2, P-well 16 are formed above p++ region 14 and is in contact with the heavily doped p++ region. This substrate structure has the advantages of making very "rugged" n-channel transistors. In the present description, the "ruggedness" of an n-channel transistor describes the transistor's characteristics in avoiding parasitic effects such as latchup and snapback. As described above, p++ region 14 provides latchup immunity by reducing the resistance of P-well 16. The heavily doped p++ region also prevents snap-back conditions in n-channel transistor 28 by preventing the parasitic npn transistor formed by the n+ source/drain regions and P-well 16 from turning on. However, in another embodiment, when "rugged" n-channel transistors are not critical to the operation of the integrated circuit, a p-well for noise producing circuits does not have to extend into the heavily doped p++ region. FIG. 3 illustrates another CMOS structure formed using the selective substrate implant process according to another embodiment of the present invention. In the CMOS structure of FIG. 3, P-well 56 is formed over the heavily doped p++ region 54 but does not extend into the p++ region. The CMOS structure of FIG. 3 may be desirable in certain applications.

Returning to FIG. 2, the CMOS structure is formed using a twin-tub process and the P-wells and N-wells are aligned to each other as a result of the self-align feature of the twin-tub process. Of course, in another embodiment, the fabrication process may use other well formation processes and the edges of the P-wells and N-wells can be separated from each other as is shown in FIG. 3. The process for forming the P-wells and the N-wells in the CMOS structure of the present invention is not critical to the selective substrate implant process of the present invention. In fact, any well formation process can be used in conjunction with the selective substrate implant process of the present invention to form heavily doped region under a selective number of wells to achieve decoupling of the power supply connections.

The main process steps and process parameters for forming the CMOS structure of FIG. 2 are now described. Of course, one skilled in the art would understand that variations in the specific process sequence and the specific process parameters can be made without departing from the spirit of the present invention. The process steps and parameters are given here as examples only and are not intended to be limiting. In the present embodiment, P-type substrate 10 is a lightly doped p-type <100>-orientation substrate. P-type substrate 10 has a resistivity of 14–28 ohm-cm. The heavily doped p++ region 14 is formed using a conventional photolithography process followed by an ion implanation step. A p++ implant mask is used to pattern the photoresist layer deposited on substrate 10. Typically, a thin oxide layer is grown on the substrate surface to act as a "screen" for the subsequent ion implantation step. The p++ implant mask can be a copy of the P-well mask with selective P-well regions removed for preventing formation of p++ regions under those P-wells. A conventional photolithography process is used to pattern the photoresist layer so that the photoresist layer covers substrate 10 except for areas where the heavily doped p++ region is to be formed. An ion implantation process follows to selectively dope the p++ regions. In the present embodiment, the ion implantation process uses boron ions at a dose of $5 \times 10^{14}$ ions/cm$^2$ and an implant energy of 80 KeV. Subsequently, a drive-in step at 1200° C. for about 2 hours is performed to diffuse the dopants and repair implantation damages. In the present embodiment, the resultant resistance of the p++ region 14 is approximately 150 Ω/□. The p-type epi layer 12 is then formed using a conventional epitaxy process. In the present embodiment, epi layer 12 is 10 μm thick and has a resistivity of 14–28 ohm-cm. Subsequent to the formation of epi layer 12, conventional CMOS process steps are used to form the N-wells, P-wells, the active area and the metallization layers to complete the integrated circuit.

The selective substrate implant process of the present invention can be used in the fabrication of CMOS analog integrated circuits for addressing the conflicting requirements of noise isolation and latchup suppression. An integrated circuit designer can select the placement of the heavily doped regions depending on the circuit parameters the designer wishes to optimize. In one application, when it is important to optimize the latchup susceptibility of the input/output circuits, the selective substrate implant process can be used to form heavily doped regions underneath P-wells in which input/output circuits are built. FIG. 4 is an exemplary selective substrate implant mask for use in the manufacture of a CMOS switching regulator according to one embodiment of the present invention. In FIG. 4, the shaded regions (such as region 84) indicates areas which will receive the p++ implant. Using implant mask 80 of FIG. 4, the p++ heavily doped regions are formed underneath the P-wells in which input, output or I/O circuits are built. Thus, the p++ regions serve the purpose of improving the latchup suppression ability of the input, output or I/O circuits.

In another application, when device ruggedness and noise decoupling are of concern, the selective substrate implant process can be used to form heavily doped regions underneath P-wells in which noise producing circuits or circuits susceptible to parasitic effects such as snap-back are built. FIG. 5 is an exemplary selective substrate implant mask for use in the manufacture of a CMOS switching regulator according to another embodiment of the present invention. In implant mask 90 of FIG. 5, the heavily doped regions are selectively placed under the input/output circuits, the digital circuitry and the power transistors as denoted by shaded area 94. In FIGS. 4 and 5, while shaded areas (84 and 94) are used to denote the general area where the p++ implant is applied, the actual heavily doped regions are not formed as a contagious layer underneath the shaded areas as is depicted in FIGS. 4 and 5. Rather, one having ordinary skilled in the art would understand that the heavily doped regions are formed only in areas where P-wells are to be built. The structure of the heavily doped regions is more accurately depicted in the cross-sectional drawings of FIGS. 2 and 3. Returning to FIG. 5, the heavily doped regions formed under area 94 function to improve the latchup immunity of the input/output circuits and to decouple the ground noise generated by the digital circuitry from the ground connection of noise sensitive circuits including the analog circuitry, the bandgap circuit and the comparator circuit. The heavily doped regions placed under the power transistors can also serve the function of preventing snapback or other parasitic effects from adversely interfering with the operation of the power transistors.

The above detailed descriptions are provided to illustrate specific embodiments of the present invention and are not intended to be limiting. Numerous modifications and variations within the scope of the present invention are possible. For example, the selective substrate implant process of the present can be used with an n-type substrate and an n-type epi layer. In that case, the selective substrate implant is used to form heavily doped n++ regions for selected N-wells. In some applications, an N-type substrate is used so that the body of the integrated circuit can be electrically coupled to the positive power supply or Vcc. In this case, the selective substrate implant process of the present invention can be used to decouple the positive power supply for the noise producing circuits from the power supply for the noise sensitive circuits. Furthermore, while only one heavily doped region is shown in each of FIGS. 2 and 3 of the present description, this is illustrative only and in actual device fabrication, numerous heavily doped regions can be formed under the desired wells as illustrated in FIGS. 4 and 5. The present invention is defined by the appended claims.

We claim:

1. A method for forming a CMOS structure, comprising:

providing a substrate of a first type;

masking a surface of said substrate to selectively expose regions of said substrate;

doping said substrate using dopants of said first type, said doping forming heavily doped regions;

forming an epitaxy layer of said first type on said substrate, said epitaxy layer being more lightly doped than said heavily doped regions;

masking a surface of said epitaxy layer to selectively expose a first group and a second group of well regions of said first type, wherein said first group of well regions are disposed over said heavily doped regions; and doping said epitaxy layer using dopants of said first type to form said first and second groups of well regions of said first type.

2. The method of claim 1, further comprising:

driving in said first and second groups of well regions until said first group of well regions extends into said heavily doped regions.

3. The method of claim 1, further comprising:

driving in said first and second well regions, wherein said first group of said well regions does not extend into said heavily doped regions.

4. The method of claim 1, further comprising:

coupling said first group of well regions to a first power supply connection; and coupling said second group of well regions to a second power supply connection, said first power supply connection and said second power supply connection having the same electrical potential.

5. The method of claim 4, wherein said first power supply connection is a ground connection for noise producing circuitry and said second power supply connection is a ground connection for noise sensitive circuitry.

6. The method of claim 1, wherein said first type is p-type semiconductor, and said dopants of said first type is p-type dopants.

7. The method of claim 1, wherein said first type is n-type semiconductor, and said dopants of said first type is n-type dopants.

8. The method of claim 1, wherein said first group of well regions are used for building noise producing circuits.

9. The method of claim 8, wherein said noise producing circuits include one of a power switch, logic circuits, or input/output circuits.

10. The method of claim 1, wherein said second group of well regions are used for building noise sensitive circuits.

11. The method of claim 10, wherein said noise sensitive circuits include one of an op-amp, a comparator, a bandgap reference circuit, an analog resistor, a current mirror, a differential pair, or a LDO (low-dropout) voltage regulator.

12. The method of claim 1, wherein a boundary of said heavily doped regions is aligned with a boundary of said first group of well regions.

13. A method of decoupling a first power supply connection from a second power supply connection in a CMOS integrated circuit, comprising:

providing a substrate of a first type;

forming heavily doped regions of said first type in said substrate;

forming an epitaxy layer of said first type on said substrate;

forming a first group and a second group of well regions of said first type in said epitaxy layer, said first group of well regions are disposed over said heavily doped regions;

coupling said first group of well regions to a first power supply connection; and coupling said second group of well regions to a second power supply connection, said first power supply connection and said second power supply connection having the same electrical potential.

14. The method of claim 13, wherein said first power supply connection is a ground connection for noise producing circuitry and said second power supply connection is a ground connection for noise sensitive circuitry.

15. The method of claim 13, wherein said first type is p-type semiconductor.

16. The method of claim 13, further comprising:

after said forming a first group and a second group of well regions, driving in said first and second groups of well regions until said first group of well regions extends into said heavily doped regions.

17. The method of claim 13, further comprising:

after said forming a first group and a second group of well regions, driving in said first and second groups of well regions, said first group of well regions does not extend into said heavily doped regions.

* * * * *